(12) United States Patent
Pelley et al.

(10) Patent No.: US 7,484,140 B2
(45) Date of Patent: Jan. 27, 2009

(54) MEMORY HAVING VARIABLE REFRESH CONTROL AND METHOD THEREFOR

(75) Inventors: Perry H. Pelley, Austin, TX (US); John M. Burgan, North Palm Beach, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 921 days.

(21) Appl. No.: 10/886,340

(22) Filed: Jul. 7, 2004

(65) Prior Publication Data

US 2006/0010350 A1 Jan. 12, 2006

(51) Int. Cl.
*G11C 29/00* (2006.01)

(52) U.S. Cl. .............................. 714/718; 714/5; 714/25; 714/30; 714/42; 714/54; 714/719; 714/721; 714/723; 714/733; 714/734; 714/745; 365/201

(58) Field of Classification Search ........................ None
See application file for complete search history.

(56) References Cited

U.S. PATENT DOCUMENTS

| | | | | |
|---|---|---|---|---|
| 4,716,551 A | * | 12/1987 | Inagaki | 365/222 |
| 4,736,344 A | | 4/1988 | Yanagisawa | |
| 5,475,646 A | * | 12/1995 | Ogihara | 365/222 |
| 5,593,903 A | * | 1/1997 | Beckenbaugh et al. | 438/18 |
| 5,619,468 A | * | 4/1997 | Ghosh et al. | 365/222 |
| 5,636,171 A | | 6/1997 | Yoo | |
| 5,654,930 A | | 8/1997 | Yoo | |
| 5,844,914 A | * | 12/1998 | Kim et al. | 714/718 |
| 5,933,381 A | | 8/1999 | Iwata | |
| 5,956,350 A | * | 9/1999 | Irrinki et al. | 714/718 |
| 6,229,747 B1 | | 5/2001 | Cho | |
| 6,272,588 B1 | * | 8/2001 | Johnston et al. | 711/106 |
| 6,426,909 B1 | * | 7/2002 | Tomita | 365/222 |
| 6,434,076 B1 | * | 8/2002 | Andersen et al. | 365/222 |
| 6,438,057 B1 | | 8/2002 | Ruckerbauer | |
| 6,483,764 B2 | | 11/2002 | Chen Hsu | |
| 6,603,696 B2 | * | 8/2003 | Janzen | 365/222 |
| 6,658,611 B1 | * | 12/2003 | Jun | 714/719 |

(Continued)

OTHER PUBLICATIONS

Takashima et al, "A Novel Power-Off Mode for a Battery-Backup DRAM," IEEE Journal of Solid-State Circuits, vol. 32, No. 1, Jan. 1997, pp. 86-91.

(Continued)

*Primary Examiner*—John P Trimmings
(74) *Attorney, Agent, or Firm*—Daniel D. Hill

(57) ABSTRACT

A memory (10) has a memory array (12), a charge pump (18), a voltage regulator (20), a refresh control circuit (16), and a refresh counter (22). The charge pump (18) provides a substrate bias to the memory array (12). The voltage regulator (20) provides a pump enable signal for maintaining a voltage level of the substrate bias within upper and lower limits. The refresh control circuit (16) controls refresh operations. The refresh counter (22) is coupled to receive the pump enable signal, and in response, provides a refresh timing signal to the refresh control circuit (16) to control a refresh rate of the memory array (12). A programmable fuse circuit (26) is provided to program the refresh rate using the counter (22). The programmable fuse circuit (26) may be programmed during wafer probe testing or board level burn-in. A built-in self test (BIST) circuit (24) may be included to facilitate testing.

2 Claims, 3 Drawing Sheets

U.S. PATENT DOCUMENTS

| | | | | |
|---|---|---|---|---|
| 7,092,303 B2* | 8/2006 | Ohlhoff | ........................ | 365/201 |
| 2002/0136075 A1 | 9/2002 | Chen Hsu | | |
| 2004/0210710 A1* | 10/2004 | Su | ............................. | 711/106 |
| 2005/0030807 A1* | 2/2005 | Perner | ........................ | 365/222 |
| 2006/0285413 A1* | 12/2006 | Shinozaki et al. | ........... | 365/222 |

OTHER PUBLICATIONS

Yamauchi et al., "A Circuit Technology for a Self-Refresh 16Mb DRAM with Less than 0.5 µA/MB Data-Retention Current," IEEE Journal of Solid-State Circuits, vol. 30, No. 11, Nov. 1995, pp. 1174-1182.

Yamauchi et al., "A Sub-0.5µA/MB Data-Retention DRAM," IEEE International Solid-State Circuits Conference, ISSCC95/Session 14/DRAM/Paper FA 14.1, pp. 224-245 & p. 373.

Choi et al., "Battery Operated 16M DRAM with Post Package Programmable and Variable Self Refresh," IEEE 1994 Symposium on VLSI Circuits Digest of Technical Papers, pp. 83-84.

Konishi et al., "A 38-ns 4-Mb DRAM with a Battery-Backup (BBU) Mode," IEEE Journal of Solid-State Circuits, vol. 25, No. 5, Oct. 1990, pp. 1112-1114.

* cited by examiner

MEMORY HAVING VARIABLE REFRESH CONTROL AND METHOD THEREFOR

CROSS-REFERENCE TO RELATED, COPENDING APPLICATION

A related, copending application is entitled "VARIABLE REFRESH CONTROL FOR A MEMORY", John Burgan, Ser. No. 10/369,985, assigned to the assignee hereof, and filed concurrently herewith.

FIELD OF THE INVENTION

This invention relates generally to integrated circuit memories, and more particularly to a dynamic random access memory (DRAM) having a variable refresh rate control.

BACKGROUND OF THE INVENTION

A dynamic random access memory (DRAM) is a well known memory type that depends on a capacitor to store charge representative of two logic states. Generally, each DRAM cell includes a capacitor and an access transistor. The charge stored on the capacitor leaks away over time, requiring the data stored by DRAM cells to be periodically read and rewritten, or "refreshed". The periodic refresh operation requires a significant amount of power.

The amount of charge leakage from the capacitors varies greatly depending on temperature and process variations. A higher temperature causes greater leakage than a relatively lower temperature. Also, process variations can cause greater leakage. Therefore, for DRAMs having a fixed refresh rate, the memory cells must be refreshed at a rate that will guarantee reliable memory retention at worst case leakage. For battery powered devices, it is important for power consumption to be as low as possible. A fixed refresh rate may require higher power consumption than is necessary for reliable operation of the battery powered memory.

Therefore, there is a need for a DRAM having a variable rate refresh control circuit that accurately determines a refresh rate to reliably control the refresh operations of the memory and reduce power consumption of the memory in battery powered applications.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Generally, the present invention provides a memory having a plurality of memory cells that require periodic refreshing to maintain stored data, a charge pump, a voltage regulator, a refresh control circuit, and a refresh counter. The charge pump provides a substrate bias to the plurality of memory cells. The voltage regulator is coupled to the charge pump and provides a pump enable signal for maintaining a voltage level of the substrate bias within upper and lower limits. The refresh control circuit controls refresh operations of the plurality of memory cells. The refresh counter is coupled to receive the pump enable signal, and in response, provides a refresh timing signal to the refresh control circuit to control a refresh rate of the plurality of memory cells. The refresh rate is adjusted by the refresh counter in response to the voltage regulator asserting the pump enable signal.

Also, a programmable fuse circuit is provided to program the refresh rate. The programmable fuse circuit may be programmed during wafer probe testing. In addition, a built-in self test (BIST) circuit may be included on the integrated circuit to facilitate the testing.

Figure 1:
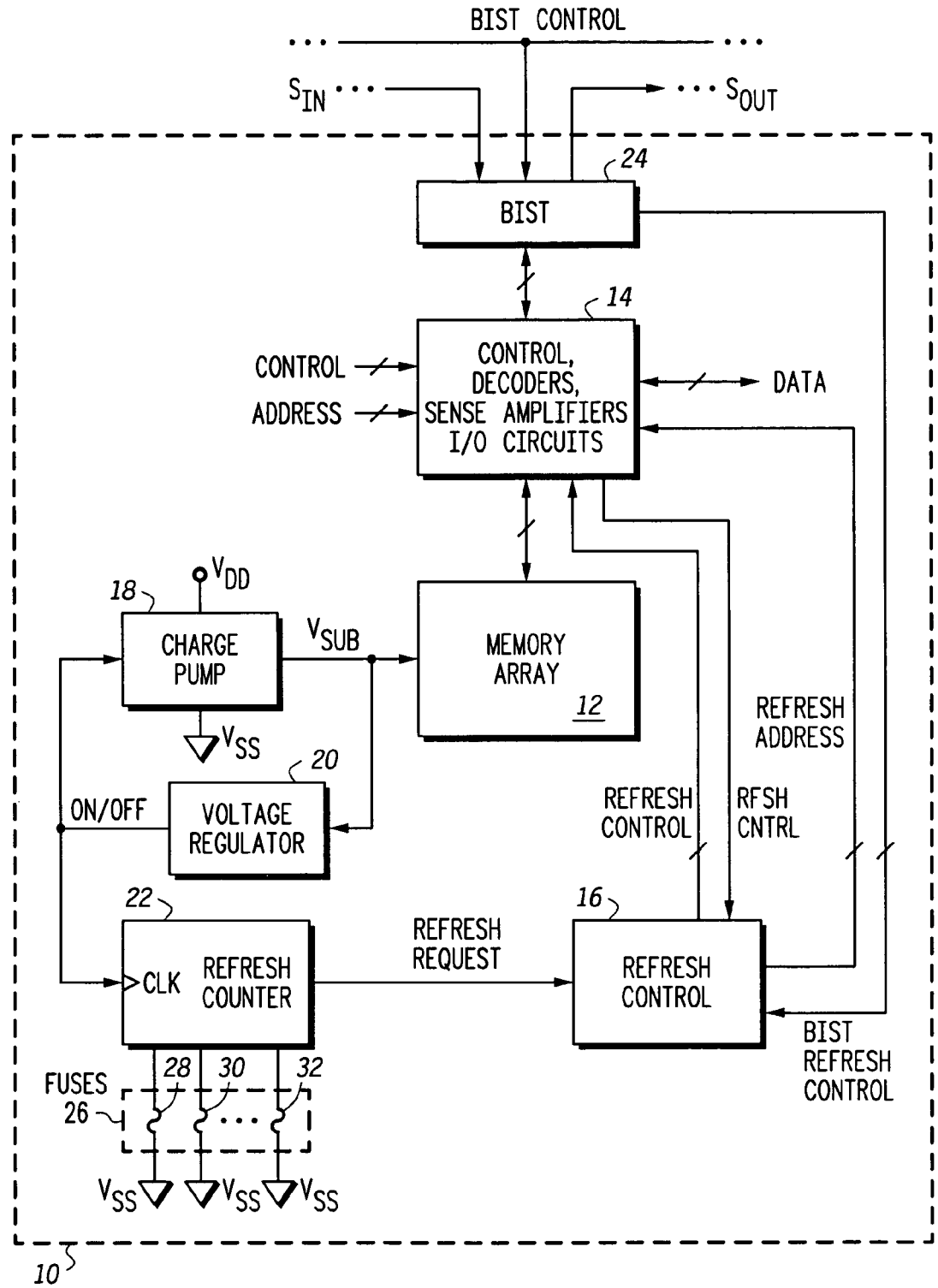
FIG. 1 illustrates, in block diagram form, an integrated circuit memory in accordance with the present invention.

Because charge leakage, as well as FET (field-effect transistor) junction leakage varies with temperature, the voltage regulator will switch the charge pump on more often as temperature increases. Therefore, as temperature increases, the refresh counter, driven by the voltage regulator pump enable signal, will increase the refresh rate of the memory array. This provides the advantage of refreshing a memory array at an optimum refresh rate over a temperature range. Also, this allows the memory to be refreshed only as frequently as necessary to provide reliable data storage for a particular temperature. An adjustable lower refresh rate based on temperature will provide lower power consumption of the memory as compared to a memory that uses a fixed higher refresh rate based on worst case temperature and process variation. Also, power consumption for the embodiment disclosed herein is further reduced because the charge pump and regulator already exist on the integrated circuit FIG. 1 illustrates, in block diagram form, an integrated circuit memory 10 in accordance with the present invention. Integrated circuit memory 10 includes memory array 12, control, decoders, sense amplifiers, and I/O circuits block 14, refresh control circuit 16, charge pump 18, voltage regulator 20, refresh counter 22, and built-in self test (BIST) circuit 24. Integrated circuit memory 10 may be a "stand-alone" memory or an embedded memory. Memory array 12 is an array of memory cells coupled at the intersections of bit lines and word lines. The memory cells may be organized in multiple blocks of memory cells. In the illustrated embodiment, the memory cells are conventional dynamic random access memory (DRAM) cells having a capacitor and an access transistor. The capacitor is for storing charge representative of a stored logic state. The access transistor is for coupling the capacitor to a bit line in response to a selected word line when accessing the memory cell. In other embodiments, memory array 12 may include other memory cell types that require periodic refreshing to maintain a stored logic state.

Block 14 includes circuits used for accessing memory array 12 for read, write, and refresh operations and is coupled to memory array 12 with a plurality of conductors. Integrated circuit memory 10 functions like a conventional DRAM during read and write operations. Block 14 includes row and column decoders, sense amplifiers, control circuits, and I/O circuits. Block 14 receives control signals labeled "CONTROL" representing the various control signals used in a memory, such as for example, write enable (WE), sense enable (SE), and the like. In response to control signals CONTROL and address signals labeled "ADDRESS", the row and column decoders access one or more memory cells of memory array 12. During a read operation, sense amplifiers sense and amplify a voltage on a selected bit line corresponding to a stored logic state and provide a corresponding logic signal to the I/O circuits for further amplification and buffering. The I/O circuits transmit buffered data signals labeled "DATA" to circuits external from memory 10. During a write operation, input data signals are provided to block 14 via bi-directional data lines DATA. The input data signals are provided to memory locations corresponding to address signals ADDRESS. Control signals CONTROL are used to control both read and write cycles.

Refresh control circuit 16 controls and coordinates refresh operations of memory array 12. Refresh operations within memory array 12 and circuit block 14 are conventional and may occur automatically, or in response to an external request for refresh via control signals labeled "RFSH CNTRL" from block 14. Refresh control circuit 16 is also coupled to circuit block 14 via a plurality of conductors labeled "REFRESH CONTROL" and a plurality of conductors labeled "REFRESH ADDRESS". In addition, refresh control 16 receives a "REFRESH REQUEST" signal from refresh counter 22 and a BIST refresh control signal from BIST circuit 24 labeled "BIST REFRESH CONTROL".

Charge pump 18 is a conventional charge pump and is used to provide a substrate bias labeled "VSUB" to memory array 12. In other embodiments, charge pump 18 may be used for other purposes. For example, charge pump 18 may be used to provide a plate voltage for the capacitors of memory array 12 or boosted word line voltages. Depending on the application, the voltage provided by charge pump 18 may be any voltage, usually beyond a supply voltage provided to power supply voltage terminals labeled "VDD" and "VSS". Typically, VDD receives a positive power supply voltage and VSS is at ground potential. In other embodiments the voltages provided to VDD and VSS may be different. Also, in other embodiments, charge pump 18 may provide an elevated voltage less than power supply voltage, or a negative voltage.

Voltage regulator 20 is a conventional voltage regulator. Voltage regulator 20 has an input coupled to receive substrate bias VSUB and an output terminal for providing control signal ON/OFF to a control input of charge pump 18. Voltage regulator 20 monitors voltage VSUB and alternately asserts and deasserts the ON/OFF signal to maintain the substrate bias VSUB within a predetermined voltage range having an upper limit and a lower limit. That is, when the ON/OFF signal is asserted, voltage VSUB increases until the upper limit voltage is reached. Voltage regulator 20 then deasserts the ON/OFF signal and charge pump 18 stops pumping until the voltage VSUB drops to the lower limit. At that point, the ON/OFF signal is again asserted and charge pump 18 begins "pumping" and VSUB increases. During normal operation of memory 10, the asserting and deasserting of the ON/OFF signal is more or less periodic. In addition, voltage regulator 20 will switch charge pump 18 on and off more frequently when voltage or temperature of memory 10 is elevated.

In addition to controlling charge pump 18, voltage regulator 20 is used to control the refresh timing of memory array 12 in accordance with the present invention. That is, the change in the switching operation of voltage regulator 20 due to temperature and voltage changes of memory 10 is used to change the refresh frequency of memory array 12 via refresh counter 22. Refresh counter 22 has a clock input terminal (CLK) coupled to voltage regulator 20 for receiving the ON/OFF signal, and an output terminal for providing a refresh request signal labeled "REFRESH REQUEST". Refresh counter 22 is used to convert the regulator ON/OFF cycles to refresh timing, taking advantage of the temperature and voltage variations of the ON/OFF cycles to vary the refresh rate. As noted above, the temperature and voltage variations affect charge leakage from the memory cell capacitors. Therefore, as the temperature or voltage of memory 10 increases, the rate at which the memory array needs to be refreshed increases. The change in frequency of the ON/OFF output of regulator 20 as the die temperature changes will, to a first order, track the array cell leakage. This is because voltage VSUB leaks in a manner similar to charge leakage from the memory cell capacitors in response to the die voltage and temperature requiring the charge pump to be turned on more frequently.

In the illustrated embodiment, the counter is a conventional modulo counter. The counter is designed to assert a REFRESH REQUEST signal each time the counter reaches a predetermined count value. In other embodiments, a different type of counter may be used. Refresh counter 22 includes programmable fuse circuits 26. Programmable fuse circuit 26 includes a plurality of fuses 28, 30 and 32. By "blowing" one or more of the plurality of fuses 28, 30, and 32, the predetermined count corresponding to the number of ON/OFF cycles between refreshes cycles may be raised or lowered for any given semiconductor die or wafer to compensate for different leakages due to process differences. The leakage rates to be compensated may vary by orders of magnitude from best to worst die. In the illustrated embodiment, plurality of fuses 28, 30 and 32 are electrically blown. In other embodiments, the plurality of fuses may be laser blown, or may include a plurality of non-volatile register bits, or the like.

According to another aspect of the present invention, the latent refresh rate of memory 10 due to process variation may be determined during wafer level testing using a BIST circuit 24. Since refresh rate tests are much longer and much more expensive that most tests, die must be tested in parallel to reduce effective test time and therefore cost. One way to test die in parallel is by using wafer level testing. For wafer level testing, all or a large subset of the die on the wafer, are probed and tested in parallel reducing overall test time.

BIST circuit 24 is bi-directionally coupled to block 14 for receiving and providing test data and control signals for testing memory array 12. Also, BIST circuit 24 provides a fresh control signal labeled "BIST REFRESH CONTROL". In addition, BIST circuit 24 receives serial test input data SIN, provides serial test output data SOUT, and receives control signals BIST CONTROL. As indicated by the dashed line defining the boundaries of integrated circuit memory 10, Signals SIN, SOUT, and BIST CONTROL are routed external to integrated circuit memory 10.

Figure 2:
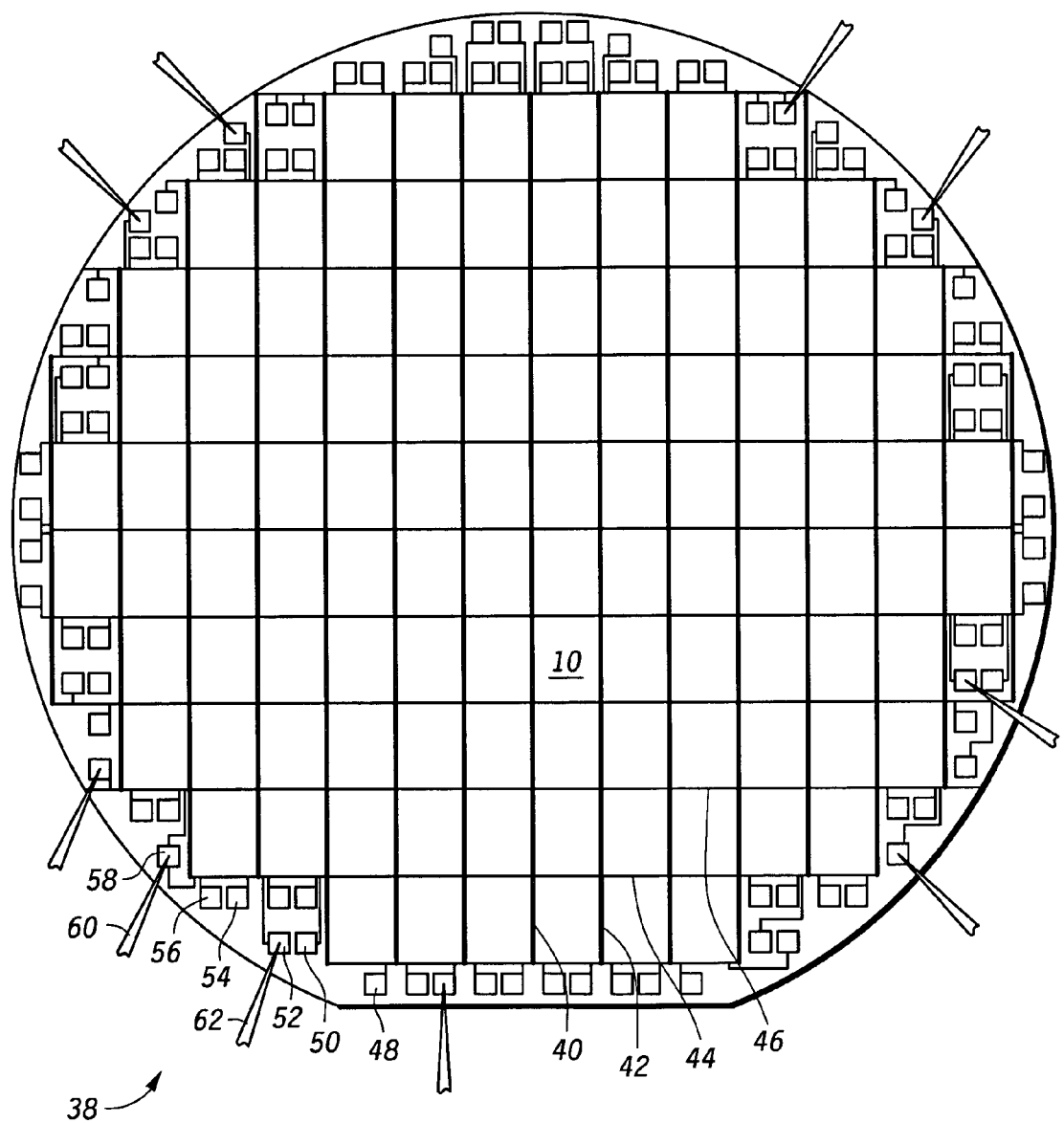
FIG. 2 illustrates a top-down view of a semiconductor wafer during wafer probe testing in accordance with the present invention.

FIG. 2 illustrates a top-down view of a semiconductor wafer 38 during wafer probe testing in accordance with the present invention. Semiconductor wafer 38 includes a plurality of integrated circuits, such as integrated circuit memory 10, which are formed using conventional semiconductor processing. During the manufacturing process, wafer 38 will be divided into individual "die". The individual die will undergo further processing after being separated. However, prior to being separated, the integrated circuits on the wafer may be testing during a procedure known as "wafer probe" or "wafer level testing". For wafer level testing, the wafer includes a plurality probe pads such as probe pads 48, 50, 52, 54, 56, and 58. The probe pads are contacted with wafer probe needles. The wafer probe needles, such as probe needles 60 and 62 in FIG. 2, are used to provide electrical contact between the test equipment and the electrical circuits formed on the wafer. In other embodiments, bumped membranes or other wafer contacting techniques may be used to electrically connect to wafer 38.

Dicing lanes are included between each of the individual die on wafer 38. For example, dicing lanes 40 and 42 run vertically on FIG. 2 and dicing lanes 44 and 46 run horizontally. The dicing lanes define the areas where the wafer will be cut to separate the wafer into individual die. Prior to being separated, however, the dicing lanes provide convenient places for routing test signals to each of the die. In the embodiment illustrated in FIG. 1, signals SIN, SOUT, and BIST CONTROL are routed in the dicing lanes to couple the die having integrated circuit memory 10 to the probe pads.

BIST circuit 24 is included on each integrated circuit on wafer 38, and is used during wafer probe of wafer 38 to individually test refresh times for the memory arrays of the plurality of integrated circuit memories. For example, referring to both FIG. 1 and FIG. 2, when integrated circuit memory 10 is to be tested, test data SIN is scanned into BIST circuit 24. Refreshing operations may be triggered using BIST REFRESH CONTROL signals. Test results are scanned out as SOUT data. The SIN and SOUT pins of adjacent die are usually coupled together into scan chains through the dicing lanes so that the test result of all of the die in the chain can be tested from a single pad. The SOUT data may include whether or not the die passed, any failed cells and failed addresses. Using the test results, refresh times can be adjusted using refresh counter 22 on a die-to-die basis. In addition, the results of testing may be used to bin, or sort, the die according to refresh times.

Figure 3:
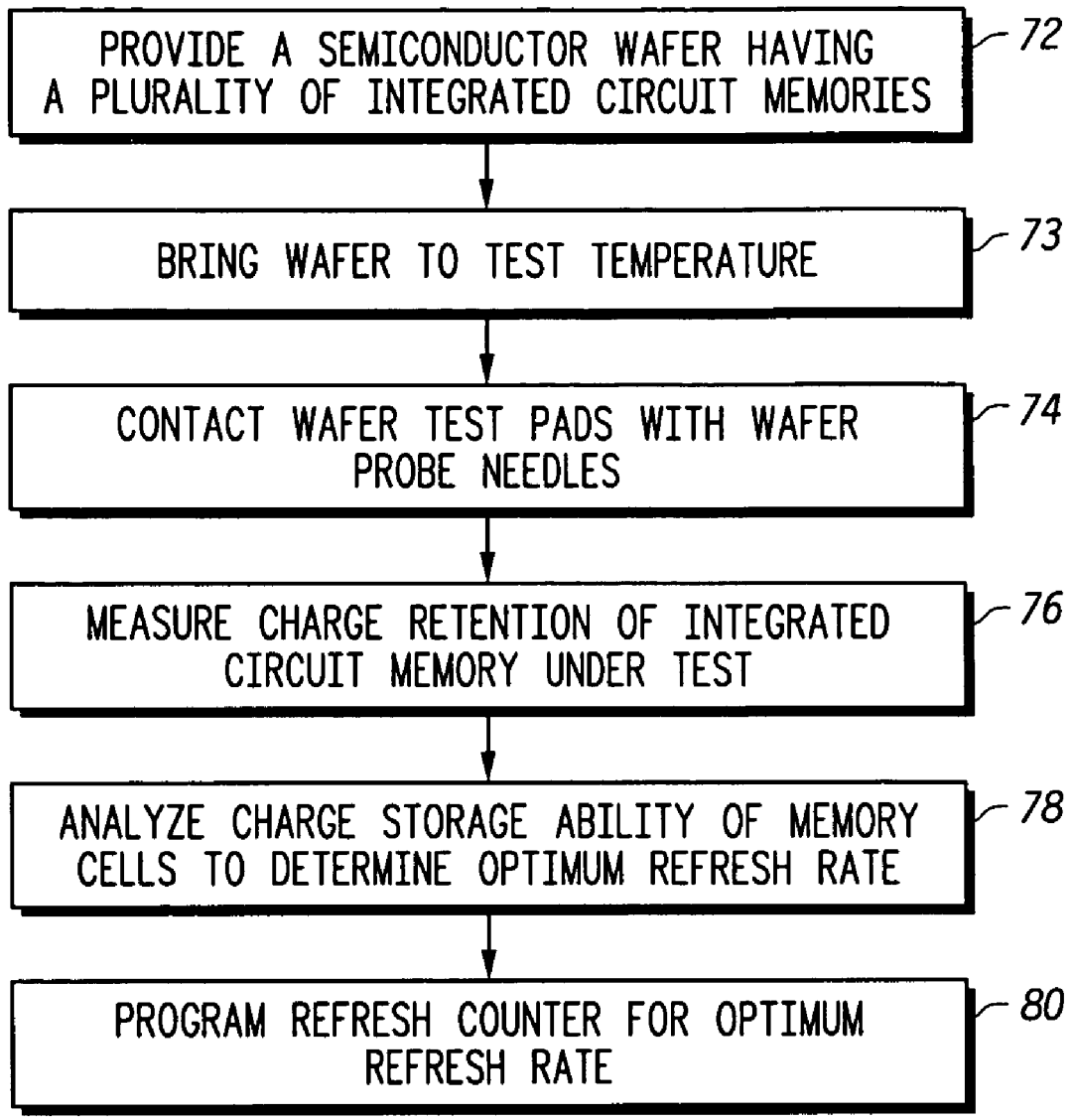
FIG. 3 illustrates, in flow diagram form, a method for testing the integrated circuit memory of FIG. 1.

FIG. 3 illustrates, in flow diagram form, a method 70 for testing a wafer 38 having a plurality of the integrated circuit memories of FIG. 1. In the illustrated embodiment, method 70 takes place during wafer level burn-in. In other embodiments, method 70 may be used is other wafer level testing environments.

At step 72, a semiconductor wafer is provided having the plurality of the integrated circuit memories. At step 73, the temperature of the wafer is adjusted to a predetermined test temperature. In the illustrated embodiment, the test temperature is significantly above room temperature, for example, 100 degrees Celsius. In other embodiments, the test temperature may be about room temperature or significantly below room temperature. At step 74, the wafer test pads are contacted with wafer probe needles to provide an electrical connection between the die under test and the testing apparatus.

At step 76, the maximum refresh rate of the plurality of memory integrated circuit die is BIST tested in parallel to determine when the memory cells on a particular die fail and the results are recorded for each of the plurality of integrated circuits.

At step 78, the charge storage ability of the plurality of memory integrated circuits is analyzed to determine refresh rates for each of the die and the corresponding fuse coordinates. At step 80, the programmable fuse circuits of the plurality of integrated circuits are programmed with the calculated fuse coordinates. The fuses may be blown either electrically, with a laser, or the like.

This allows each of the die to be refreshed at an optimum refresh rate with regard to process variations of individual die. Because the memory is refreshed only as frequently as necessary to provide reliable data storage for a particular temperature, power consumption of the memory is reduced as compared to a memory that uses a fixed higher refresh rate that is based on worst case temperature.

In yet another embodiment, the die may be tested at "board level burn-in" using a conventional burn-in printed circuit board. The BIST control signals BIST CONTROL and serial data signals SIN and SOUT are routed using board traces. Testing is generally as described above for FIG. 3, first the packaged integrated circuits to be tested are inserted in test sockets of a burn-in printed circuit board. The typical burn-in board has enough test sockets to accommodate parallel testing of eight or more packaged integrated circuits. The packaged integrated circuits are brought up to test temperature. While at test temperature, the charge retention of the integrated circuit memories are measured. Then, the charge storage ability of the packaged integrated circuits is analyzed to determine a refresh rate. Finally, the programmable fuse circuits 26 are set to program the refresh counter with the refresh rate. As discussed above, with reference to FIG. 2, the refresh rate of each packaged integrated circuit can be determined individually. One difference between board level burn-in and wafer level burn-in is that the fuses must be blown electrically because the die are already packaged. A disadvantage with board level burn-in is that fewer integrated circuit memories can be tested in parallel as compared to wafer level burn-in. However, burn-in times for packaged integrated circuits are usually much longer than BIST test times, so refresh testing according to the present invention does not extend the board level burn-in times.

Various changes and modifications to the embodiments herein chosen for purposes of illustration will readily occur to those skilled in the art. For example, variations in the types of conductivities of transistors, the types of transistors, etc. may be readily made. To the extent that such modifications and variations do not depart from the scope of the invention, they are intended to be included within the scope thereof, which is assessed only by a fair interpretation of the following claims.

What is claimed is:

1. A method for testing a plurality of integrated circuit memories, each of the integrated circuit memories having a plurality of memory cells that require periodic refreshing to maintain stored data, the method comprising the steps of:

providing a semiconductor wafer having the plurality of the integrated circuit memories, each of the plurality of integrated circuit memories having a refresh counter for providing a refresh timing signal to a refresh control circuit to control a refresh rate of the plurality of memory cells;

providing a programmable fuse circuit coupled to the refresh control circuit on each of the plurality of integrated circuit memories;

providing a built-in self test (BIST) circuit on each of the plurality of integrated circuit memories for scanning test data into and out of the plurality of memory cells on each of the plurality of integrated circuit memories;

providing a plurality of wafer test pads coupled to the BIST circuits on the semiconductor wafer;

contacting the wafer test pads with wafer probe needles;

measuring a charge retention ability of the plurality of memory cells on each of the plurality of integrated circuit memories;

analyzing the charge retention ability of the plurality of memory cells on each of the plurality of integrated circuit memories to determine a plurality of refresh rates, a refresh rate corresponding to each of the plurality of integrated circuit memories; and programming each of the programmable fuse circuits of the plurality of integrated circuit memories with its corresponding refresh rate.

2. The method of claim 1, further comprising the step of adjusting a test temperature of the semiconductor wafer.

* * * * *